US005710054A

United States Patent [19]
Gardner et al.

[11] Patent Number: 5,710,054
[45] Date of Patent: Jan. 20, 1998

[54] METHOD OF FORMING A SHALLOW JUNCTION BY DIFFUSION FROM A SILICON-BASED SPACER

[75] Inventors: Mark L Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 703,273

[22] Filed: Aug. 26, 1996

[51] Int. Cl.$^6$ .................. H01L 21/265; H01L 21/225; H01L 21/385
[52] U.S. Cl. .................. 437/44; 437/40; 437/160; 437/162
[58] Field of Search .................. 437/405 W, 415 W, 437/44, 162, 160

[56] References Cited

U.S. PATENT DOCUMENTS

| | | | |
|---|---|---|---|
| 5,064,776 | 11/1991 | Roberts | 437/162 |
| 5,391,508 | 2/1995 | Matsuoka et al. | 437/44 |
| 5,457,060 | 10/1995 | Chang | 437/34 |
| 5,466,958 | 11/1995 | Kakuma | 257/345 |
| 5,504,031 | 4/1996 | Ching-Hsiang et al. | 437/57 |
| 5,559,049 | 9/1996 | Cho | 437/44 |
| 5,591,650 | 1/1997 | Hsu et al. | 437/44 |

*Primary Examiner*—Brian Dutton
*Attorney, Agent, or Firm*—Skjerven, Morrill, MacPherson, Franklin & Friel, LLP; David M. Sigmond

[57] ABSTRACT

A method of forming a shallow junction in an IGFET is disclosed. The method includes forming a gate insulator on a semiconductor substrate of first conductivity type, forming a gate electrode on the gate insulator, forming a sidewall insulator on an edge of the gate electrode, forming a silicon-based spacer over the substrate such that the sidewall insulator separates and electrically isolates the spacer and the gate electrode, and diffusing a dopant of second conductivity type from the spacer into the substrate. The diffused dopant forms a shallow region of second conductivity type in the substrate, and a shallow junction is substantially laterally aligned with the edge of the gate electrode.

57 Claims, 11 Drawing Sheets

METHOD OF FORMING A SHALLOW JUNCTION BY DIFFUSION FROM A SILICON-BASED SPACER

BACKGROUND OF THE INVENTION

1. Field of the Invention

The present invention relates to integrated circuit manufacturing, and more particularly to method of forming a junction for an insulated-gate field-effect transistor.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during formation of the source and drain regions by ion implantation. The resistance of polysilicon can be further reduced by forming a silicide on its top surface.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

There are several drawbacks to using ion implantation. A phenomena called "channeling" may occur when the ion beam which implants the dopants is closely aligned with the crystal lattice of the silicon. When channeling occurs, the dopants are initially implanted deeper beneath the top surface of the substrate, but then as implantation continues the substrate surface becomes amorphous and less channeling occurs. Unfortunately, the depth of the channeled dopants is difficult to control. Channeling can be avoided by tilting the substrate (typically, at an angle of 7°) with respect to the ion beam. However, implanting off-axis can cause asymmetric doping of the source and drain regions.

Another drawback of ion implantation is random scattering of the implanted dopants. The random scattering results in a small portion of implanted regions, measured as the "lateral straggle," being disposed beneath the mask.

A further drawback of ion implantation is that the concentration (or doping profile) of the implanted dopants typically forms a gaussian distribution along the vertical axis in which the peak concentration is substantially below the top surface of the substrate. Furthermore, driving-in the dopants by high-temperature processing causes the implanted dopants to diffuse farther into the substrate.

A strategy for enhancing IGFET performance is to have the dopant atoms as close to the surface of the substrate as possible. Restricting current flow to a very narrow layer between the source and drain tends to improve current drive properties, and also reduce off-state leakage current. Accordingly, as IGFET dimensions are reduced, it is highly desirable to form shallow channel junctions on the order of 0.01 to 0.15 microns deep in order to improve transistor performance. However, LDD regions and other source/drain structures are frequently formed using ion implantation. Even as ion implantation energies are scaled down to the range of 5 to 10 kiloelectron-volts and smaller, it remains difficult or impossible to form well-controlled shallow junctions using conventional semiconductor implantation equipment.

SUMMARY OF THE INVENTION

The present invention provides an improved method of forming a shallow junction for an IGFET transistor. A key feature of the invention is forming the shallow junction by diffusing a dopant from a silicon-based spacer into the substrate. The spacer is disposed in close lateral relationship to a gate electrode so that the shallow junction is substantially aligned with an edge of the gate electrode. Preferably, the shallow junction has a depth in the range of about 0.01 to 0.15 microns.

Accordingly, an object of the present invention is provide shallow junctions which are less susceptible to the channeling, lateral diffusion, and other drawbacks associated with conventional ion implantation techniques.

In one embodiment of the invention, the method includes the steps of forming a gate insulator on a semiconductor substrate of first conductivity type, forming a gate electrode on the gate insulator, forming a sidewall insulator on the edge of the gate electrode, forming a silicon-based spacer over the substrate and adjacent to the sidewall insulator, and diffusing a dopant of second conductive type from the spacer into the substrate to form a shallow region of the second conductivity type in the substrate. The shallow region forms the shallow junction.

In other embodiments of the invention, the silicon-based spacer can be formed directly on the substrate, or formed on a thin oxide layer on the substrate. The shallow region can be an LDD region, in which case a heavily doped region is implanted using the silicon-based spacer as a mask and then merged with the LDD region. Alternatively, the shallow region can provide the source or the drain. In either case, the spacer provides an electrical contact to the shallow region and/or the heavily doped region. The sidewall insulator can be an oxide grown or deposited on the edge of the gate electrode. The spacer can be doped either before or after it is formed by an anisotropic etch. In yet another variation, the gate electrode and spacer can be oppositely doped silicon-based materials disposed adjacent to one another, such that adjacent sidewalls form a PN junction. Reverse-biasing the PN junction during operation serves to electrically isolate the gate electrode and the spacer.

The sidewall insulator can cover an edge of the gate insulator and extend to the substrate. Alternatively, the sidewall insulator can extend only to the bottom of the gate electrode so that the spacer is formed on a portion of the substrate adjacent to the gate insulator. Furthermore, to increase the lateral overlap between the shallow junction and the gate electrode, the spacer can be formed on a portion of the substrate that is recessed with respect to a portion of the substrate underlying the gate electrode so that the dopant diffuses laterally through a sidewall of the substrate. As exemplary materials, the gate electrode and spacer are polysilicon, the gate insulator and sidewall insulators are oxides, and the dopant is boron, arsenic, or phosphorus.

An advantage of the invention is that the diffused dopant from the silicon-based spacer is well-suited to forming shallow junctions. Another advantage is that the concentration of the diffused dopant in the shallow region typically resembles the upper-half of a gaussian distribution along the vertical axis in which the peak dopant concentration is in close proximity to the top surface of the substrate. As a result, the shallow region and junction are relatively well controlled.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
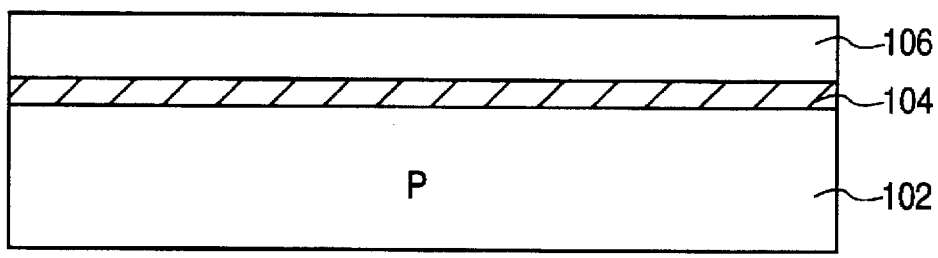
FIGS. 1A-1F show cross-sectional views of successive process steps for forming a shallow junction in accordance with a first embodiment of the invention.

In the drawings, depicted elements are not necessarily drawn to scale and like or similar elements may be designated by the same reference numeral throughout the several views.

FIGS. 1A-1F show cross-sectional views of successive process steps for forming a shallow junction in accordance with a first embodiment of the invention.

In FIG. 1A, a gate electrode material is disposed on a gate insulator material, which in turn is disposed on a semiconductor substrate suitable for integrated circuit manufacture. For instance, substrate 102 includes a P-type epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using robe growth at a temperature of 700° to 1000° C. in an $O_2$ containing ambient. Gate oxide 104 has a thickness in the range of 30 to 200 angstroms. Thereafter, a blanket layer of polysilicon 106 is deposited by low pressure chemical vapor deposition on the top surface of gate oxide 104. Polysilicon 106 has a thickness in the range of 250 to 4000 angstroms. Polysilicon 106 is doped by ion implantation of arsenic at a dose in the range of $1 \times 10^{15}$ to $5 \times 10^{15}$ atoms/cm$^2$ and an energy in the range of 2 to 80 kiloelectron-volts. Alternatively, if desired, polysilicon 106 can be doped by a subsequent source/drain implant.

Figure 1B:
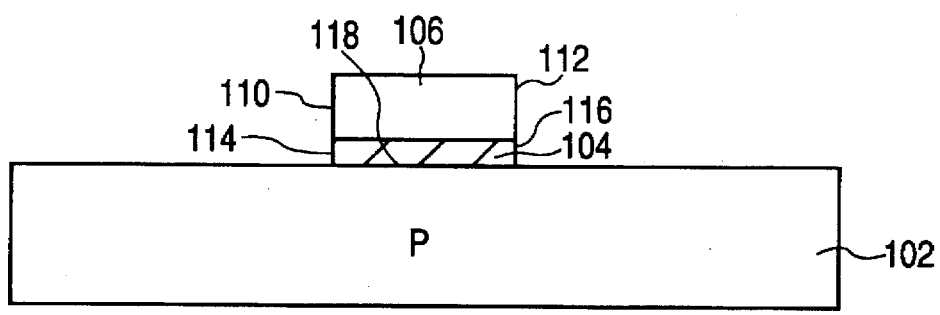

In FIG. 1B, the gate electrode material and the gate insulator material are patterned to provide the gate electrode and gate insulator, respectively. For instance, polysilicon 106 and gate oxide 104 are patterned using conventional photolithography and an anisotropic etch. For submicron dimensions, patterning a photoresist mask (not shown) by I-line photolithography using a mercury vapor lamp is preferred. After the photoresist mask is patterned, an isotropic etch is applied, polysilicon 106 is etched back to provide a gate electrode, and gate oxide 104 is etched back to provide a gate insulator. Preferably, a first etchant is applied that is highly selective of polysilicon, then a second etchant is applied that is highly selective of oxides. After etching occurs, polysilicon 106 includes opposing vertical edges 110 and 112, and gate oxide 104 includes opposing vertical edges 114 and 116. Edges 110 and 114 are substantially laterally aligned, and edges 112 and 116 are substantially laterally aligned. Polysilicon 106 has a length (between edges 110 and 112) of about 0.4 to 0.5 microns. The portions of substrate 102 outside polysilicon 106 are exposed and substantially unaffected by the etch. Therefore, the top surface of substrate 102 outside polysilicon 106 is substantially vertically aligned (or coplanar) with portion 118 of substrate 102 underlying polysilicon 106.

Figure 1C:
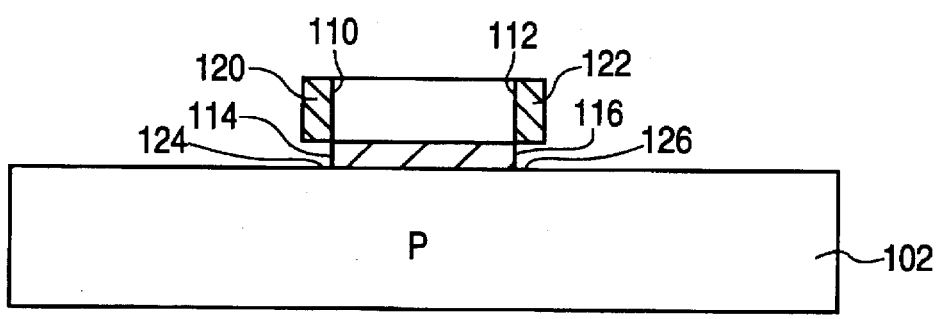

In FIG. 1C, a sidewall insulator is formed on an edge of the gate electrode. For instance, a layer of oxide (such as $SiO_2$) is formed on the exposed silicon surfaces using a rapid thermal anneal. The oxidation rate of polysilicon is greater that the oxidation rate of single crystal silicon, particularly if the polysilicon is doped with arsenic. Therefore, the oxide grown on substrate 102 can be removed using a single dip in a wet chemical etchant. Furthermore, the oxide grown on the top surface of polysilicon 106 can also be removed using conventional techniques, such as a second dip in a wet chemical etchant. As a result, thin sidewall oxides 120 and 122 cover polysilicon edges 110 and 112, respectively. Sidewall oxides 120 and 122 each extend a lateral distance in the range of 200 to 1000 angstroms, have about the same height as polysilicon 106, and are vertically spaced from substrate 102. Portions 124 and 126 of substrate 102 beneath sidewall oxides 120 and 122, respectively, are exposed, and oxide edges 114 and 116 are exposed.

Figure 1D:
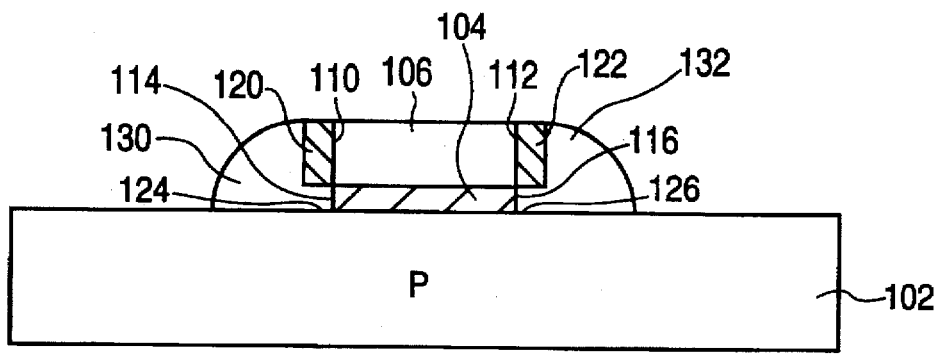

In FIG. 1D, a silicon-based spacer is formed over the substrate, such that the sidewall insulator is disposed between the gate electrode and the spacer. For instance, a second blanket layer of polysilicon is deposited by low pressure chemical vapor deposition over substrate 102, and the second blanket layer of polysilicon is doped by ion implantation of arsenic at a dose in the range of $1\times10^{13}$ to $5\times10^{14}$ atoms/cm$^2$ and an energy in the range of 2 to 80 kiloelectron-volts. Thereafter, an anisotropic etch, provided by a reactive ion etch, is applied to the second blanket layer of polysilicon to form polysilicon spacers 130 and 132. Spacers 130 and 132 contact portions of substrate 102 including portions 124 and 126, respectively. Spacers 130 and 132 also contact gate oxide edges 114 and 116, respectively, and sidewall oxides 120 and 122, respectively. However, spacers 130 and 132 do not contact polysilicon 106. Instead, spacers 130 and 132 are laterally spaced from and electrically isolated from edges 110 and 112 of polysilicon 106 by sidewall oxides 120 and 122, respectively. The height of spacers 130 and 132 is substantially the same as the combined heights of gate oxide 104 and polysilicon 106.

Figure 1E:
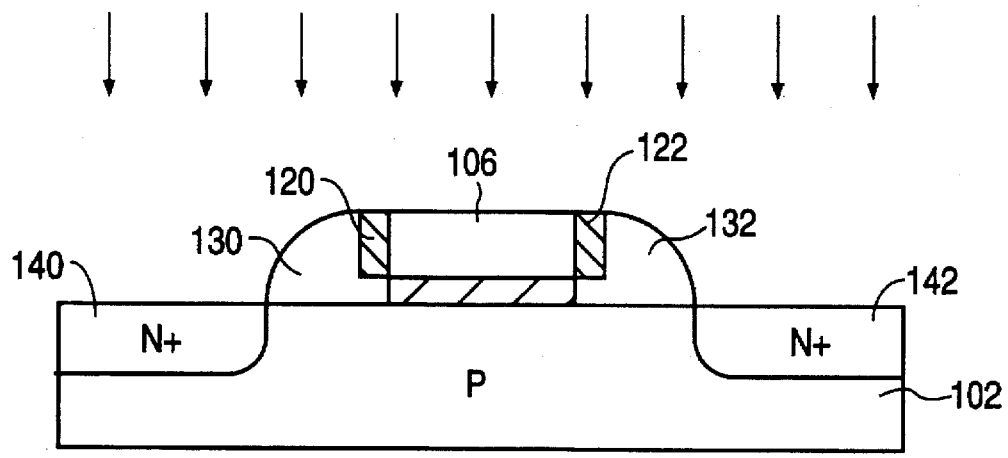

In FIG. 1E, a heavily doped region is implanted into the substrate using the spacer as a mask. For instance, heavily doped N+ regions 140 and 142 are formed in substrate 102 using polysilicon 106, sidewall oxides 120 and 122, and spacers 130 and 132 as an implant mask. The implant is performed using arsenic at a dosage of $1\times10^{15}$ to $5\times10^{15}$ atoms/cm$^2$ and an energy in the range of 2 to 80 kiloelectron-volts. As a result, heavily doped regions 140 and 142 have an N+ arsenic concentration in the range of $1\times10^{18}$ to $1\times10^{19}$ atoms/cm$^3$ and a depth in the range of 0.02 to 0.3 microns.

Figure 1F:
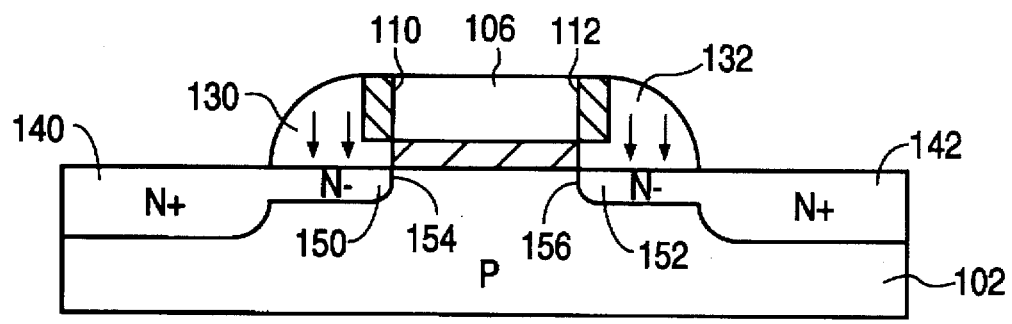

In FIG. 1F, the dopant atoms in the silicon-based spacer are diffused into the substrate. For instance, a rapid thermal anneal on the order of 950° to 1050° C. for 10 to 30 seconds serves to drive arsenic atoms out of spacers 130 and 132. The arsenic atoms diffuse from spacers 130 and 132 into substrate 102 to form shallow regions 150 and 152, respectively, which are lightly doped N– with an arsenic concentration in the range of $1\times10^{17}$ to $1\times10^{18}$ atoms/cm$^3$ and a depth in the range of 0.01 to 0.15 microns. Of importance, essentially all of the N-type doping in shallow regions 150 and 152 is provided by diffusion from spacers 130 and 132, respectively. Preferably, heavily doped regions 140 and 142 have a substantially greater depth than shallow regions 150 and 152. Shallow regions 150 and 152 form shallow junctions 154 and 156, respectively, which are substantially laterally aligned with edges 110 and 112, respectively, of polysilicon 106. Thus, junctions 154 and 156 define the channel length of an N-channel MOSFET controlled by polysilicon 106. Shallow regions 150 and 152 are lightly doped regions due to the relatively light doping of spacers 130 and 132. The anneal (or drive-in) step also activates the implanted dopants in regions 140 and 142 and diffuses them farther into substrate 102. In this manner, regions 140 and 150 merge to form a drain (in which region 150 provides an LDD), and regions 142 and 152 merge to form a source. As is seen, the drain and source are entirely within and extend to the top surface of substrate 102. In addition, regions 140 and 142 laterally diffuse beneath spacers 130 and 132, respectively. As a result, spacer 130 is in electfical contact with region 140 and provides a drain contact, and spacer 132 is in electrical contact with region 142 and provides a source contact.

FIGS. 2A–2F show cross-sectional views of successive process steps for forming a shallow junction in accordance with a second embodiment of the invention. It is often desirable to minimize the lateral overlap between the gate electrode and the source/drain, since reducing overlap capacitance improves switching speeds. However, decreasing the channel length increases drive current. Thus, the overlap between the gate electrode and source/drain involves a tradeoff between switching speed and drive current. The primary difference between the second embodiment and the first embodiment is that in the second embodiment, a portion of the substrate outside the gate electrode is recessed so that the spacers contact a sidewall of the substrate, dopants laterally diffuse from the spacers through the sidewall, and therefore the lateral overlap between the shallow region and the gate electrode is increased. Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
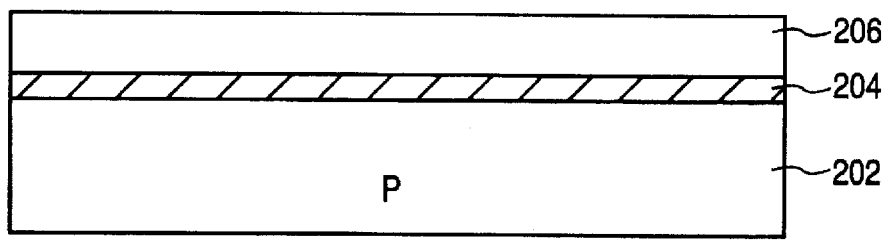
FIGS. 2A-2F show cross-sectional views of successive process steps for forming a shallow junction in accordance with a second embodiment of the invention.

In FIG. 2A, gate oxide 204 is formed on substrate 202, and polysilicon 206 is formed on gate oxide 204.

Figure 2B:
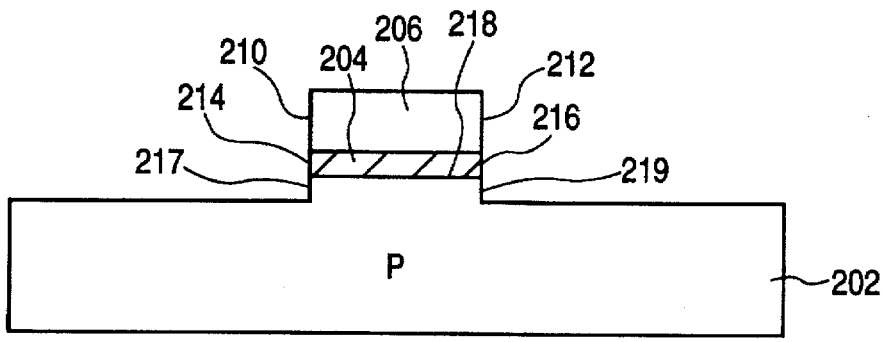

In FIG. 2B, the gate electrode material and the gate insulator material are patterned to provide the gate electrode and gate insulator, respectively. In FIG. 2B, unlike FIG. 1B, a substantial portion of the substrate outside the gate electrode is partially etched back. For instance, polysilicon 206 and gate oxide 204 are etched in a similar manner to polysilicon 106 and gate oxide 104, respectively. Thereafter, the photoresist mask (not shown) is left in place, and another etch is applied so that the portion of substrate 202 outside the remaining polysilicon 206 is partially etched back between 100 to 2000 angstroms. Preferably, substrate 202 is etched using the same etchant applied to polysilicon 206. After etching occurs, polysilicon 206 includes opposing vertical edges 210 and 212, gate oxide 204 includes opposing vertical edges 214 and 216, and substrate 202 includes opposing vertical edges 217 and 219. Edges 210, 214 and 217 are substantially laterally aligned, as are edges 212, 216 and 219. Therefore, the top surface of substrate 202 outside polysilicon 206 is recessed with respect to portion 218 of substrate 202 underlying polysilicon 206.

Figure 2C:
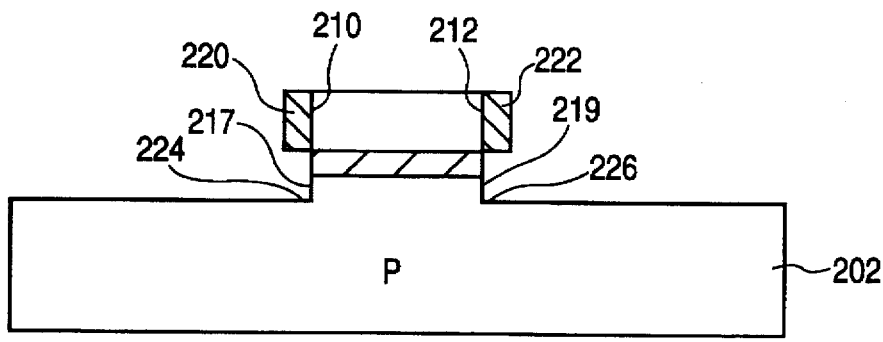

In FIG. 2C, thin sidewall oxides 220 and 222 are formed on polysilicon edges 210 and 212, respectively. Portions 224 and 226 of substrate 202 are located beneath sidewall oxides 220 and 222, respectively, are adjacent to substrate edges 217 and 219, respectively, and are exposed.

Figure 2D:
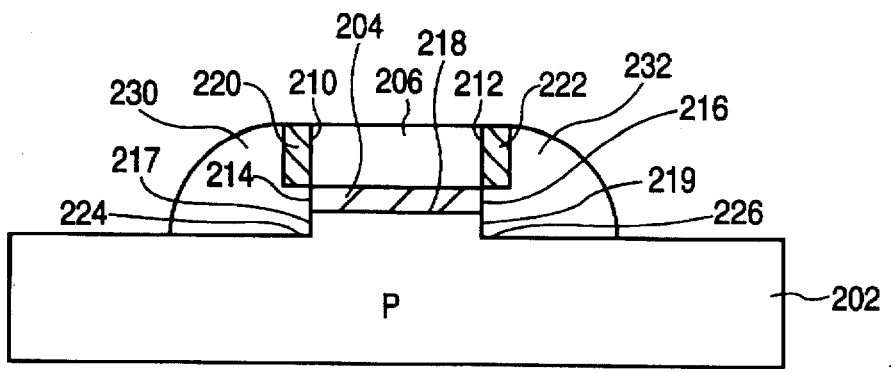

In FIG. 2D, spacers 230 and 232 are formed on substrate 202. Spacers 230 and 232 contact edges 217 and 219, respectively, and portions 224 and 226, respectively, of substrate 202. Spacers 230 and 232 also contact gate oxide edges 214 and 216, respectively, and sidewall oxides 220 and 222, respectively. However, spacers 230 and 232 are laterally separated and electrically isolated from polysilicon 206.

Figure 2E:
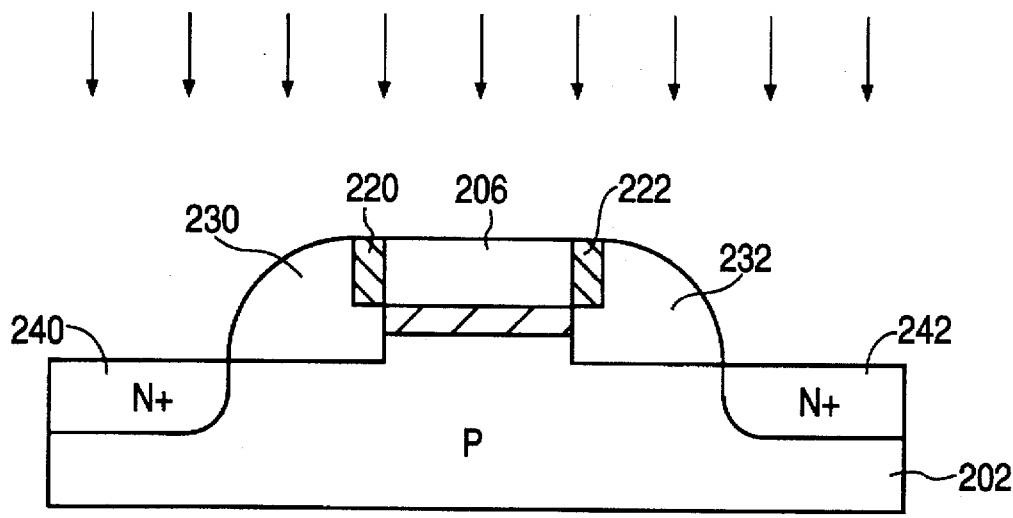

In FIG. 2E, heavily doped regions 240 and 242 are formed in substrate 202 using polysilicon 206, sidewall oxides 220 and 222, and spacers 230 and 232 as an implant mask.

Figure 2F:
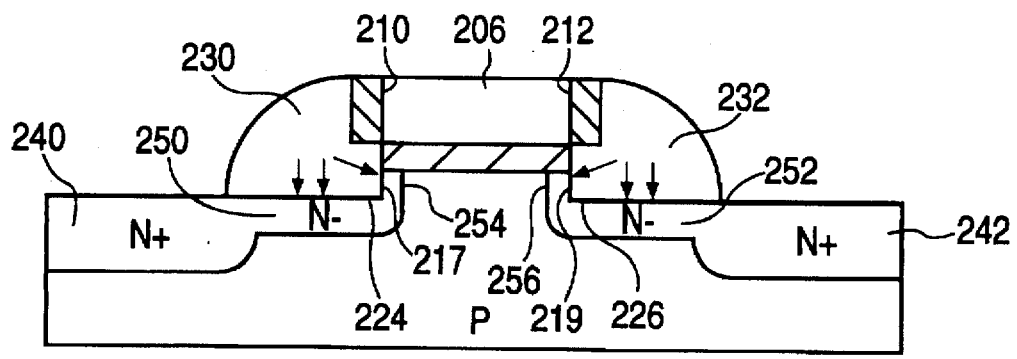

In FIG. 2F, the dopant in the silicon-based spacers is diffused into the substrate. Thus, the dopant vertically diffuses through the recessed surface of the substrate. In addition, unlike FIG. 1F, the dopant also laterally diffuses through a sidewall of the substrate that is substantially laterally aligned with an edge of the gate electrode. Accordingly, the arsenic atoms vertically diffuse from spacers 230 and 232 through the recessed portion of substrate 202 including portions 224 and 226, respectively, and the arsenic atoms laterally diffuse from spacers 230 and 232 through sidewalls 217 and 219, respectively, toward the lateral center of polysilicon 206. As a result, there is more lateral overlap between shallow regions 250, 252 and polysilicon 206, than there is between shallow regions 150, 152 and polysilicon 106. Shallow regions 250 and 252 form shallow junctions 254 and 256, respectively, which are substantially laterally aligned with edges 210 and 212, respectively, of polysilicon 206, although the lateral overlap is somewhat greater than that of junctions 154 and 156 with edges 110 and 112, respectively. Regions 250 and 252 are lightly doped regions which merge with regions 240 and 242, respectively, to form a drain and source, respectively, in electrical contact with spacers 230 and 232, respectively.

FIGS. 3A–3E show cross-sectional views of successive process steps for forming a shallow junction in accordance with a third embodiment of the invention. The present invention is well-suited for forming P-channel MOSFETs as well as N-channel MOSFETs. Boron is a commonly used P-type dopant. Unfortunately, boron tends to diffuse much faster than typical N-type dopants such as arsenic and phosphorus, and also tends to diffuse laterally by significant amounts. Accordingly, when boron is the dopant, it may be desirable to retard the diffusion of boron to assure that the shallow regions are properly formed and well controlled. One method of retarding boron diffusion from the spacer is by disposing a thin barrier between the spacer and the substrate. The primary difference between the third embodiment and the first embodiment is that in the third embodiment, the spacers are doped with boron, and the spacers are formed on a spacer insulator formed on the substrate, instead of the spacers being formed directly on the substrate. Unless otherwise noted, the elements for the third embodiment (e.g., substrate 302, gate oxide 304, etc.) are similar to elements of the first embodiment (e.g., substrate 102, gate oxide 104, etc.), and the description of related elements and process steps need not be repeated.

Figure 3A:
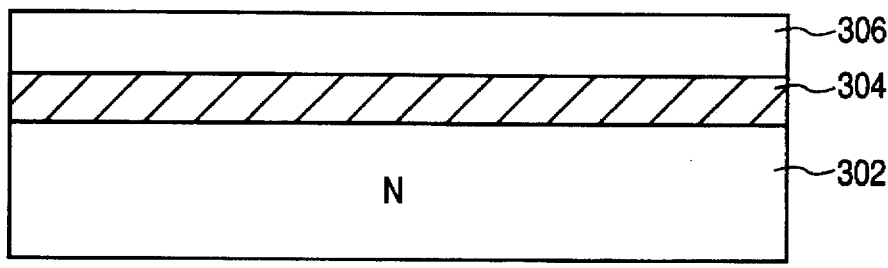
FIGS. 3A-3E show cross-sectional views of successive process steps for forming a shallow junction in accordance with a third embodiment of the invention.

In FIG. 3A, gate oxide 304 is formed on substrate 302, and polysilicon 306 is formed on gate oxide 304. Substrate 302 is similar to substrate 102, except substrate 302 is doped N-type.

Figure 3B:
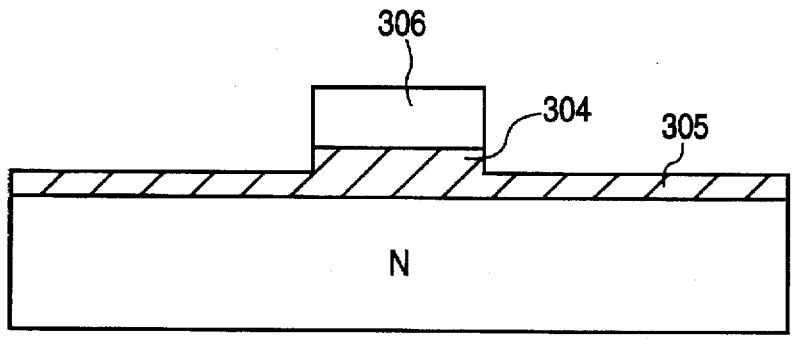

In FIG. 3B, the gate electrode material and the gate insulator material are patterned to provide the gate electrode and gate insulator, respectively, and a spacer insulator is also formed. In FIG. 3B, unlike FIG. 1B, a substantial portion of the gate oxide outside the gate electrode is not removed. For instance, polysilicon 306 is etched in a similar manner to polysilicon 106, then gate oxide 304 outside polysilicon 306 is partially etched back in the range of 20 to 150 angstroms to a thickness in the range of 10 to 50 angstroms. For convenience of explanation, the partially etched back oxide outside polysilicon 306 is referred to as spacer oxide 305. As discussed below, spacer oxide 305 is used to retard (but not block) diffusion of the dopant from the silicon-based spacer into the substrate. If desired, spacer oxide 305 can be implanted with nitrogen to further retard the diffusion.

Figure 3C:
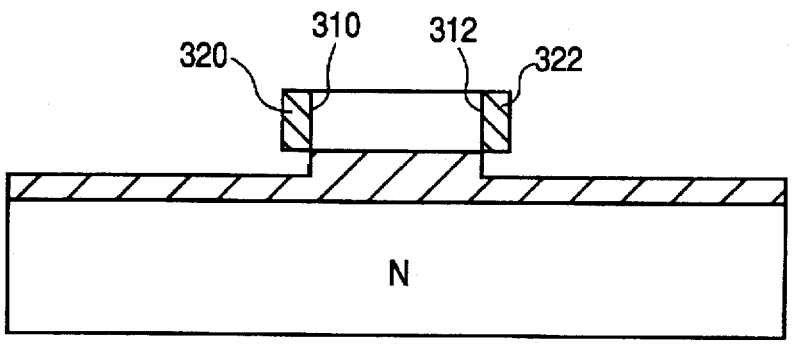

In FIG. 3C, thin sidewall oxides 320 and 322 are formed on polysilicon edges 310 and 312, respectively.

Figure 3D:
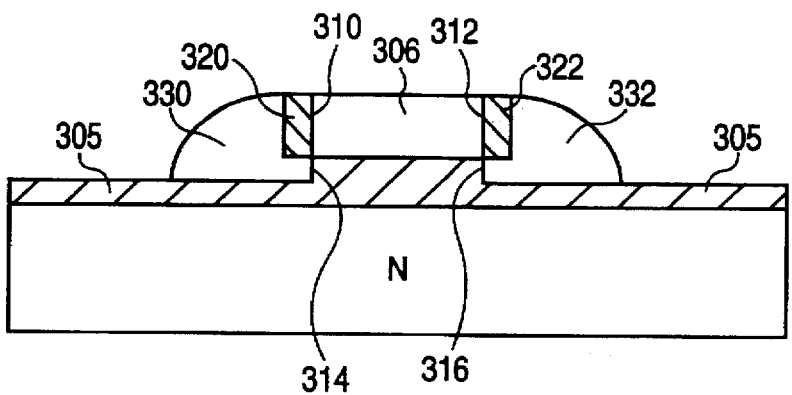

In FIG. 3D, the silicon-based spacer is formed over the substrate. In FIG. 3D, unlike FIG. 1D, the spacer does not contact the substrate. Instead, the spacer insulator is disposed between the spacer and the substrate. For instance, spacers 330 and 332 are formed on spacer oxide 305. Spacers 330 and 332 also contact gate oxide edges 314 and 316, respectively, and sidewall oxides 320 and 322, respectively, but are laterally spaced from and electrically isolated from edges 310 and 312 of polysilicon 306 by sidewall oxides 320 and 322, respectively. Spacers 330 and 332 also differ from spacers 130 and 132 in that spacers 330 and 332 are formed from a blanket layer of polysilicon doped by ion implantation of boron at a dose in the range $1\times10^{15}$ to $5\times10^{15}$ atoms/cm$^2$ and an energy in the range of 2 to 80 kiloelectron-volts before the spacer etch is applied. Thus, spacers 330 and 332 as compared to spacers 130 and 132 are doped with a more rapidly diffusing species at a dosage higher by approximately one to two orders of magnitude.

Figure 3E:
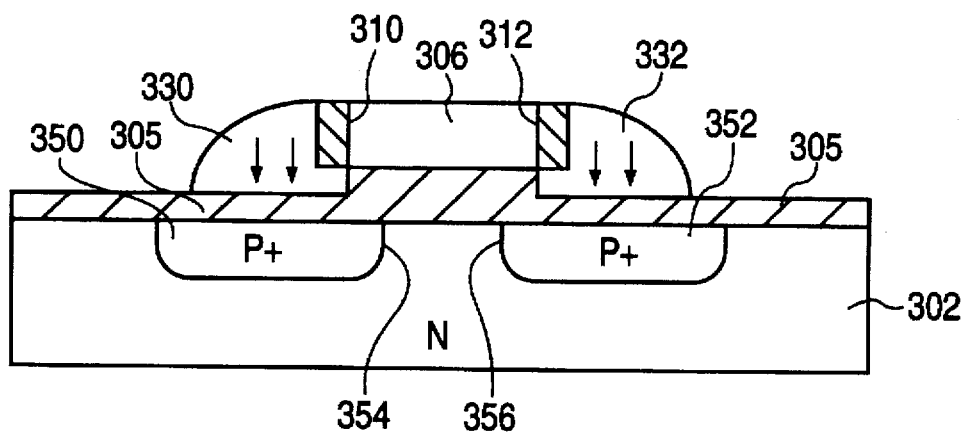

In FIG. 3E, the dopant in the silicon-based spacer is diffused through the spacer insulator into the substrate to form a source or drain region. In FIG. 3E, unlike FIGS. 1E and 1F, the dopant diffused from the spacers provides all the doping for the source and drain, and therefore the implant step (FIG. 1E) is unnecessary. For instance, a rapid thermal anneal on the order of 800° to 1000° C. for 10 to 30 seconds serves to drive boron atoms out of spacers 330 and 332. The diffusing boron atoms are retarded by spacer oxide 305, but a significant number diffuse through spacer oxide 305 into substrate 302 to form shallow P+ regions 350 and 352 with a boron concentration in the range of $1\times10^{18}$ to $1\times10^{19}$ atoms/cm$^3$ and a depth in the range of 0.01 to 0.15 microns. Shallow regions 350 and 352 form shallow junctions 354 and 356, respectively, which are substantially laterally aligned with edges 310 and 312, respectively, of polysilicon 306, although the lateral overlap is somewhat greater than that of junctions 154 and 156 with edges 110 and 112, respectively. In any event, junctions 354 and 356 define the channel length of a P-channel MOSFET controlled by polysilicon 306. Shallow regions 350 and 352 provide drain and source regions, respectively, as opposed to lightly doped regions, due to the relatively heavy doping of spacers 330 and 332, and the diffusion characteristics of boron. It is noted that spacers 330 and 332 are electrically isolated from regions 350 and 352 by spacer oxide 305. Therefore, other source and drain contacts would need to be employed, for instance by forming contact windows through spacer oxide 305 and depositing titanium in the contact windows.

FIGS. 4A–4E show cross-sectional views of successive process steps for forming a shallow junction in accordance with a fourth embodiment of the invention. It may be desirable to reduce the overlap between the gate electrode and the source/drain regions, as mentioned above. Lateral diffusion may occur as the dopant diffuses from the spacer, particularly if the dopant is boron. Similarly, after the dopant diffuses from the spacer into the substrate, a certain amount of lateral diffusion may occur during a subsequent thermal cycle. The amount of lateral diffusion depends on various parameters including the type of dopant, the temperature and duration of the thermal cycle, the device geometry, and so on. If a significant lateral diffusion is expected, and reducing overlap capacitance is of importance, then it may be desirable to laterally space the spacer from the channel region in order to offset the anticipated lateral diffusion. The lateral spacing can be provided by insulative spacers that extend to the substrate. The primary difference between the fourth embodiment and the third embodiment is that in the fourth embodiment, the gate oxide outside the gate electrode is completely removed (as in the first embodiment), and the sidewall oxides are provided by oxide spacers that extend to the substrate and cover the edges of the gate oxide. Unless otherwise noted, the elements for the fourth embodiment (e.g., substrate 402, gate oxide 404, etc.) are similar to elements of the third embodiment (e.g., substrate 302, gate oxide 304, etc.), and the description of related elements and process steps need not be repeated.

Figure 4A:
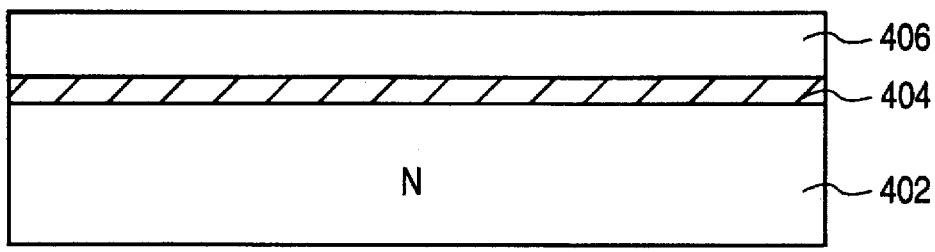
FIGS. 4A-4E show cross-sectional views of succesive process steps for forming a shallow junction in accordance with a fourth embodiment of the invention.

In FIG. 4A, gate oxide 404 is formed on substrate 402, and polysilicon 406 is formed on gate oxide 404. Substrate 402 is doped N-type.

Figure 4B:
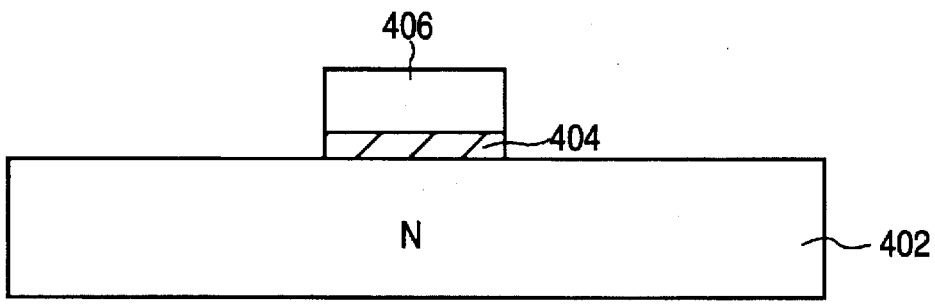

In FIG. 4B, the gate electrode material and the gate insulator material are patterned to provide the gate electrode and gate insulator. For instance, polysilicon 406 is etched in a similar manner to polysilicon 106, and gate oxide 404 is etched in a similar manner to gate oxide 104.

Figure 4C:
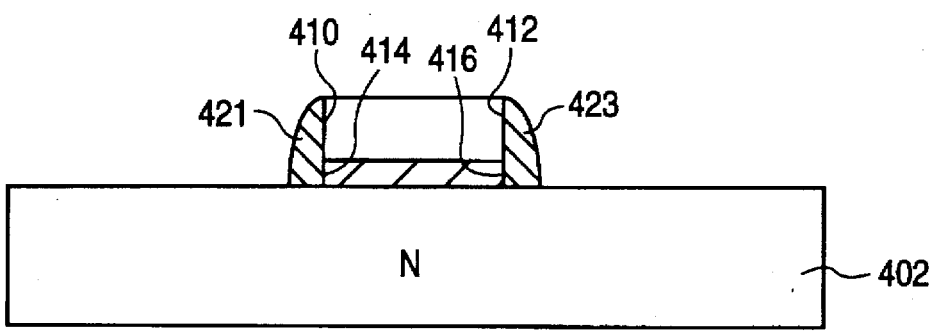

In FIG. 4C, insulative spacers are formed adjacent to the gate electrode. Unlike the previous embodiments, the insulative spacers extend to the substrate and cover the edges of the gate oxide as well. For instance, a second blanket layer of oxide (such as $SiO_2$) is deposited over substrate 402, and thereafter an anisotropic etch is applied to form oxide spacers 421 and 423. Oxide spacers 421 and 423 are formed on polysilicon edges 410 and 412, respectively, on gate oxide sidewalls 414 and 416, respectively, and on portions of substrate 402 adjacent to oxide sidewalls 414 and 416, respectively. Oxide spacers 421 and 423 each laterally extend about 700 angstroms along substrate 402 adjacent to gate oxide sidewalls 414 and 416, respectively. To ensure a high quality interface under the oxide spacers, it may be desirable to form a thin oxide layer (not shown) between the oxide spacers and the underlying substrate.

Figure 4D:
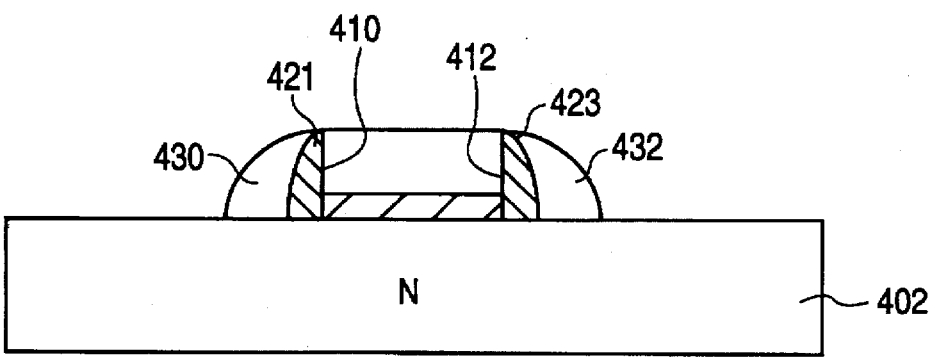

In FIG. 4D, the silicon-based spacer is formed over the substrate. In FIG. 4D, unlike FIG. 3D, the silicon-based spacer does not contact the gate insulator. For instance, polysilicon spacers 430 and 432 contact the sides of oxide spacers 421 and 423, respectively, opposite polysilicon 406, and contact portions of substrate 402 outside oxide spacers 421 and 423, respectively. Nonetheless, polysilicon spacers 430 and 432 are laterally spaced from and electrically isolated from edges 410 and 412 of polysilicon 406 by oxide spacers 421 and 423, respectively. Also, polysilicon spacers 430 and 432 are doped without doping substrate 402.

Figure 4E:
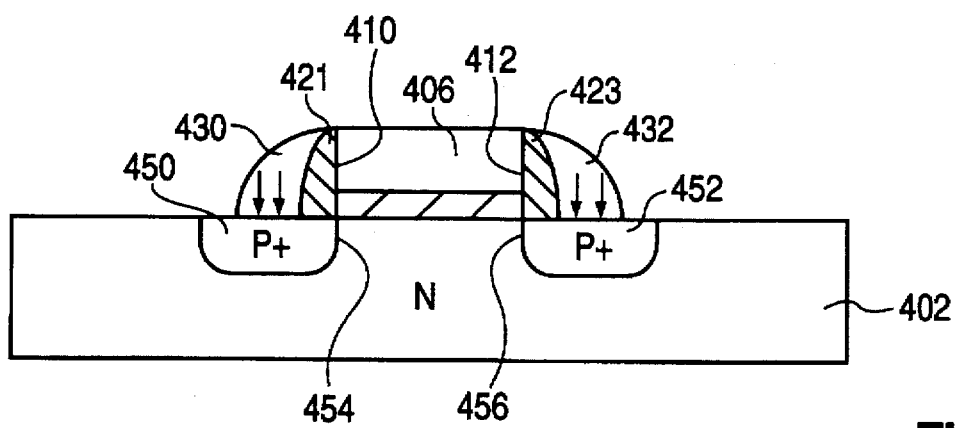

In FIG. 4E, the dopant in the silicon-based spacer is diffused directly into the substrate to form a source or drain region. In FIG. 4E, unlike FIG. 3E, the boron is diffused directly into the underlying substrate without a retarding insulator layer therebetween. Furthermore, in FIG. 4E, a significant amount of the rapidly diffusing boron atoms laterally diffuse beneath oxide spacers 421 and 423. As a result, shallow P+ regions 450 and 452 with a boron concentration in the range of $1\times10^{18}$ to $1\times10^{19}$ atoms/cm$^3$ and a depth in the range of 0.01 to 0.15 microns form shallow junctions 454 and 456, respectively, which are substantially laterally aligned with edges 410 and 412, respectively, of polysilicon 406. Shallow regions 450 and 452 provide drain and source regions, respectively, as opposed to lightly doped regions. Furthermore, spacers 430 and 432 make electrical contact with regions 450 and 452, respectively, and therefore provide drain and source contacts, respectively.

FIGS. 5A–5E show cross-sectional views of successive process steps for forming a shallow junction in accordance with a fifth embodiment of the invention. As still another variation, the sidewall insulator can be omitted by providing a gate electrode doped to a first conductivity type adjacent to a silicon-based spacer doped to a second conductivity type, such that the adjacent sidewalls form a PN junction. In operation, the PN junction can be reverse-biased, thereby electrically isolating the gate electrode from the spacer. The primary difference between the fifth embodiment and the third embodiment is that in the fifth embodiment, the sidewall oxides are omitted, and the spacers are formed adjacent to the polysilicon gate. Unless otherwise noted, the elements for the fifth embodiment (e.g., substrate 502, gate oxide 504, etc.) are similar to elements of the third embodiment (e.g., substrate 302, gate oxide 304, etc.), and the description of related elements and process steps need not be repeated.

Figure 5A:
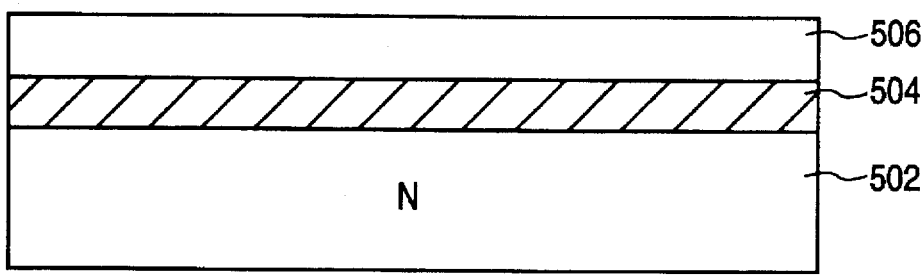
FIGS. 5A-5D show cross-sectional views of successive process steps for forming a shallow junction in accordance with a fifth embodiment of the invention.
Figure 5B:
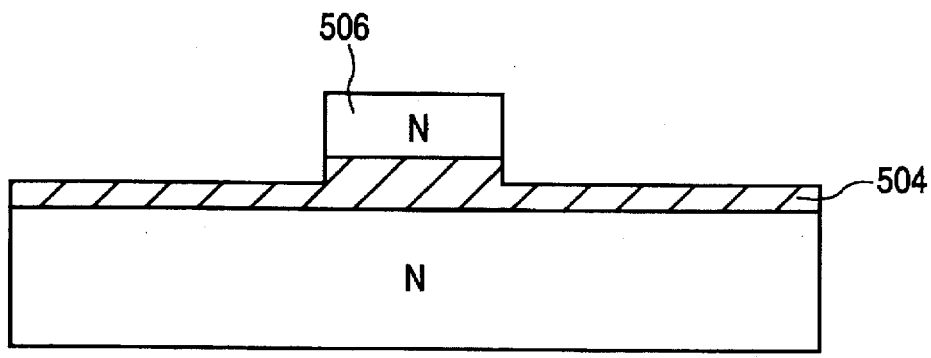
Figure 5C:
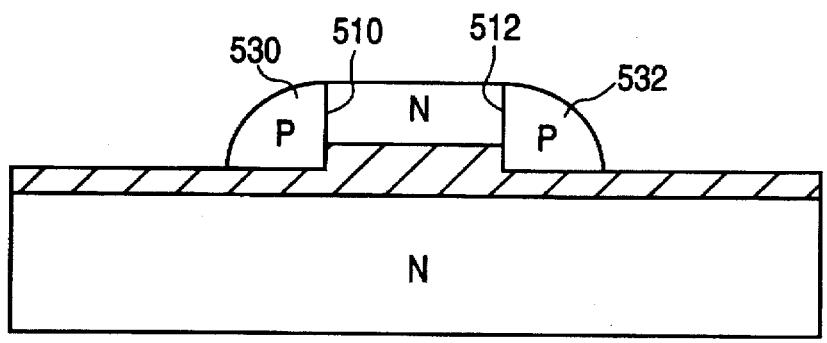
Figure 5D:
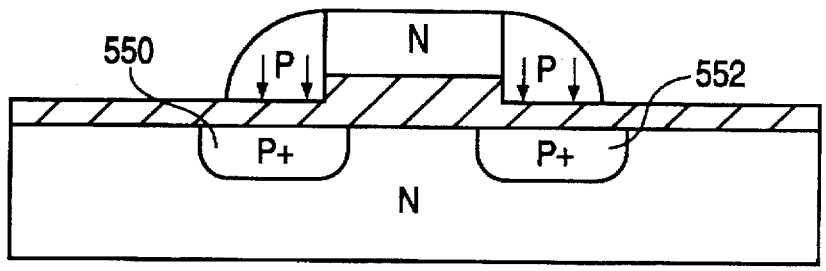

In FIG. 5A, gate oxide 504 is formed on substrate 502, and polysilicon 506 is formed on gate oxide 504. In FIG. 5B, polysilicon 506 is etched in a similar manner to polysilicon 306, and gate oxide 504 is etched in a similar manner to gate oxide 304. In FIG. 5C, the sidewall oxide (FIG. 3C) is omitted and spacers 530 and 532 are formed adjacent to edges 510 and 512, respectively, of polysilicon 506. Spacers 530 and 532 are doped P-type, and polysilicon 506 is doped N-type. Various techniques for forming adjacent polysilicon regions with alternate doping are well-known in the art. In FIG. 5D shallow regions 550 and 552 are formed.

FIGS. 6A–6F show cross-sectional views of successive process steps for forming a shallow junction in accordance with a sixth embodiment of the invention. Doping the silicon-based spacers before implanting the heavily doped regions is not essential. As another variation, the silicon-based spacers can be doped during the implant step for the heavily doped regions of the drain and source, thereby reducing the number of implant steps. The primary difference between the sixth embodiment and the first embodiment is that in the sixth embodiment, the silicon-based spacers are formed undoped, and are subsequently doped when the heavily doped regions are implanted. Unless otherwise noted, the elements for the sixth embodiment (e.g., substrate 602, gate oxide 604, etc.) are similar to elements of the first embodiment (e.g., substrate 102, gate oxide 104, etc.), and the description of related elements and process steps need not be repeated.

Figure 6A:
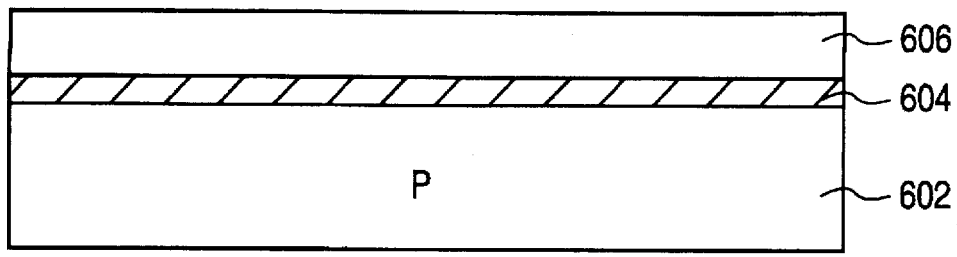
FIGS. 6A-6F show cross-sectional views of successive process steps for forming a shallow junction in accordance with a sixth embodiment of the invention.
Figure 6B:
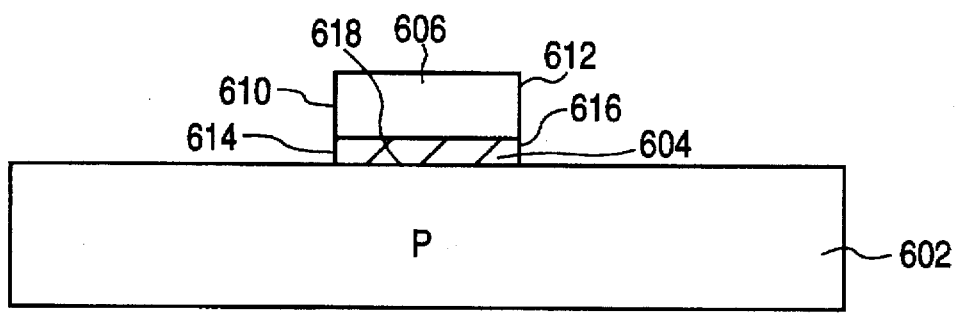
Figure 6C:
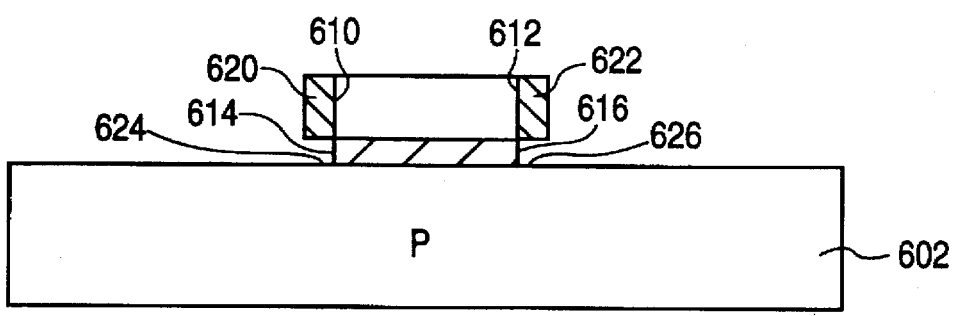

In FIG. 6A, gate oxide 604 is formed on substrate 602, and polysilicon 606 is formed on gate oxide 604. In FIG. 6B, polysilicon 606 is etched in a similar manner to polysilicon 106, and gate oxide 604 is etched in a similar manner to gate oxide 104. Similarly, in FIG. 6C, thin sidewall oxides 620 and 622 are formed on polysilicon edges 610 and 612, respectively.

Figure 6D:
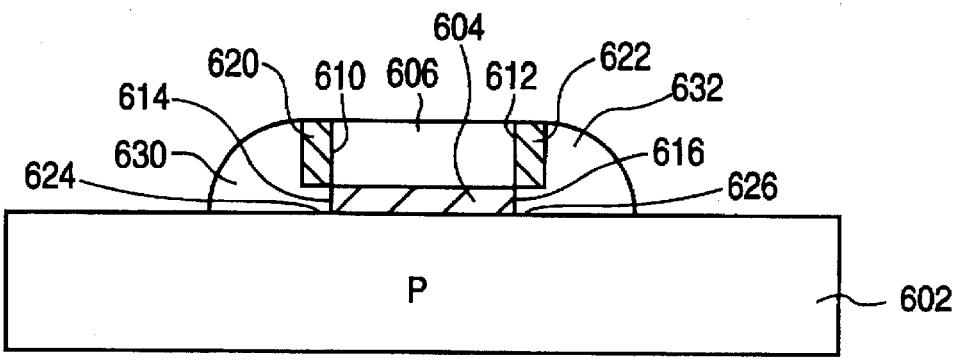

In FIG. 6D, spacers 630 and 632 are formed. However, unlike spacers 130 and 132, spacers 630 and 632 are formed undoped.

Figure 6E:
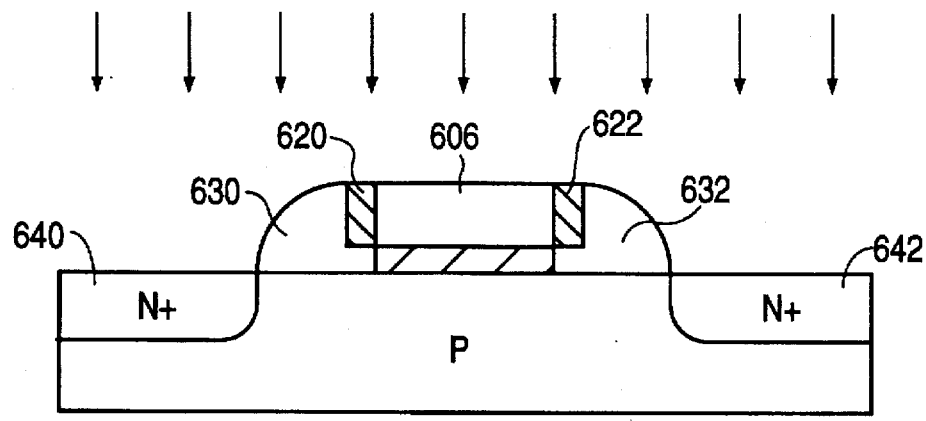
Figure 6F:
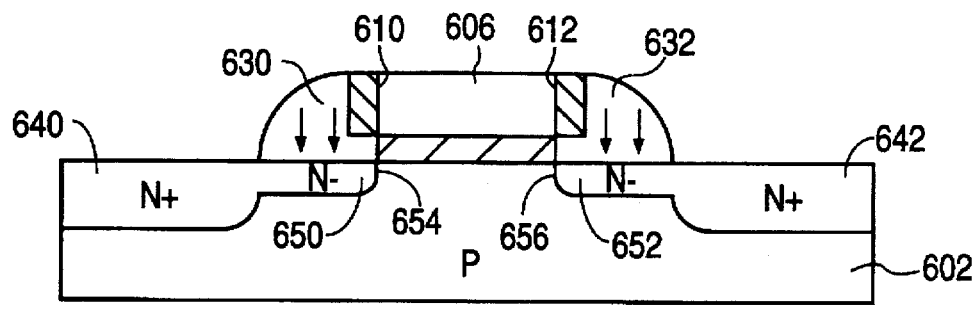

In FIG. 6E, heavily doped regions 640 and 642 are formed, and the implantation also serves to dope previously undoped spacers 630 and 632. An advantage to this approach is that spacers 630 and 632 need not be doped in a separate step. A disadvantage, however, is that the doping of spacers 630 and 632 is restricted to suitable implant parameters for heavily doped regions 640 and 642. In FIG. 6F, shallow regions 650 and 652 are formed with shallow junctions 654 and 656 substantially laterally aligned with edges 610 and 612, respectively, of polysilicon 606.

Further processing steps in the fabrication of IGFETs typically include forming a thick oxide layer over the active regions, forming contact windows in the oxide layer to expose the drain, source and gate electrode, forming appropriate interconnect metallization in the contact windows, and forming a passivation layer. In addition, subsequent high temperature process steps can be used to supplement or replace the drive-in step to provide the desired anneal, activation, and drive-in functions. These further processing steps are conventional and need not be repeated herein. Likewise the principal processing steps disclosed herein may be combined with other steps readily apparent to those skilled in the art.

At completion of the process, it is preferred that the lateral locations of the shallow junctions be precisely controlled. However, to the extent that the lateral locations of the shallow junctions are not (or can not be) precisely controlled, it is far preferable to have a slight overlap between the shallow junctions and the gate electrode as opposed to a lateral displacement or gap. While a slight overlap will lead to capacitive effects, a lateral displacement or gap may prevent the formation of a conductive channel between the source and drain during device operation.

The present invention includes numerous variations to the embodiments described above. For instance, the gate electrode (except for the fifth embodiment) can be a conductor such as a metal, and the silicon-based spacers can be amorphous silicon, polysilicon, or other silicon-based materials capable of being doped N-type or P-type. The gate insulator can various dielectrics, and the sidewall insulator can also be various dielectrics such as silicon dioxide or silicon nitride. The sidewall insulator can be formed by various techniques including deposition, robe growth and rapid thermal anneal growth. Furthermore, the sidewall insulator can be a blanket layer that is etched in the regions where the silicon-based spacers are desired. The polysilicon gate electrode can be doped after the silicon-based spacers are doped, for instance at the same time the heavily doped regions (outside the spacers) are implanted. Likewise, the silicon-based spacers can be deposited doped or undoped, and if deposited undoped can be doped either before or after the spacer etch. N-type or P-type dopants can be used in any of the embodiments described above. Likewise, the substrate can be recessed outside the gated electrode in any of the embodiments described above. The dopants can be diffused from the spacers to the substrate by applying various combinations of heat and pressure. The spacer insulator can be used for other dopants besides boron, although other dopants are more likely to accumulate in the spacer insulator without diffusing into the substrate. Other suitable P-type dopants include boron $B_{10}$, and boron $B_{11}$, and $BF_X$ species such as $BF_2$. If desired, after the shallow junctions are formed, the silicon-based spacers can be removed and/or replaced by other spacers such as conventional oxide spacers.

The invention is particularly well-suited for fabricating N-channel MOSFETs, P-channel MOSFETs, and other types of IGFETs, particularly for high-performance microprocessors where high circuit density is essential. Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming a shallow junction for an IGFET, comprising the steps of:
    forming a gate electrode over a semiconductor substrate;
    forming a silicon-based spacer over the substrate and in close lateral relationship to the gate electrode; and
    diffusing a dopant from the spacer into the substrate to form a shallow region with a shallow junction substantially aligned with an edge of the gate electrode, wherein the shallow region has a depth in the range of about 0.01 to 0.15 microns.

2. The method of claim 1, further including forming a sidewall insulator on the edge of the gate electrode, then forming the spacer on an edge of the sidewall insulator opposite the gate electrode, such that the sidewall insulator laterally separates and electrically isolates the gate electrode and the spacer.

3. The method of claim 2, wherein the spacer is formed on the substrate.

4. The method of claim 3, wherein the spacer is formed on a portion of the substrate that is recessed with respect to another portion of the substrate underlying the gate electrode.

5. The method of claim 3, wherein the sidewall insulator is vertically spaced from the substrate, and the spacer contacts a portion of the substrate beneath the sidewall insulator.

6. The method of claim 3, wherein the sidewall insulator is an oxide spacer that contacts the substrate.

7. The method of claim 2, wherein the spacer is formed on an insulating layer formed on the substrate.

8. The method of claim 1, wherein the gate electrode is a silicon-based material doped to a first conductivity type, the spacer is a silicon-based material doped to a second conductivity type, and sidewalls of the gate electrode and spacer contact one another and form a PN junction.

9. The method of claim 1, wherein forming the spacer includes blanket depositing a silicon-based material over the substrate, and then applying an anisotropic etch.

10. The method of claim 1, wherein the dopant is introduced into the spacer after the spacer is formed.

11. A method of forming a shallow junction for an IGFET, comprising the steps of:
    forming a gate insulator on a semiconductor substrate of first conductivity type;
    forming a gate electrode on the gate insulator;
    forming a sidewall insulator adjacent to an edge of the gate electrode;
    forming a silicon-based spacer over the substrate and adjacent to the sidewall insulator such that the sidewall insulator is between the spacer and the gate electrode; and
    diffusing a dopant of second conductive type from the spacer into the substrate so as to form a shallow region of the second conductivity type in the substrate, wherein the shallow region forms a shallow junction substantially aligned with the edge of the gate electrode, and the shallow region has a depth in the range of about 0.01 to 0.1 microns.

12. The method of claim 11, wherein the spacer is formed on the substrate.

13. The method of claim 11, further comprising forming a spacer insulator on the substrate, and forming the spacer on the spacer insulator such that the dopant diffuses from the spacer through the spacer insulator into the substrate.

14. The method of claim 13, further comprising depositing a single insulator layer which provides both the gate insulator and the spacer insulator.

15. The method of claim 11, wherein the sidewall insulator is vertically spaced from the substrate, and the spacer contacts a portion of the substrate beneath the sidewall insulator.

16. The method of claim 15, wherein the spacer contacts the gate insulator.

17. The method of claim 11, wherein the shallow region provides a drain for the IGFET.

18. The method of claim 11, further comprising implanting a dopant of second conductivity type into the substrate using the spacer as an implant mask before diffusing the dopant of second conductivity type from the spacer into the substrate to form the shallow junction.

19. The method of claim 11, further comprising etching the substrate after forming the gate electrode and before forming the spacer and before forming the sidewall insulator, thereby forming a recessed portion of the substrate having a sidewall that is substantially laterally aligned with the edge of the gate electrode.

20. The method of claim 19, wherein the spacer is formed on the recessed portion of the substrate and contacts the sidewall of the recessed portion of the substrate.

21. The method of claim 11, wherein the sidewall insulator extends to the substrate.

22. The method of claim 11, wherein the gate electrode is polysilicon, the spacer is selected from the group consisting of amorphous silicon and polysilicon, the gate insulator is a silicon dioxide, and the sidewall insulator is selected from the group consisting of silicon dioxide and silicon nitride.

23. The method of claim 11, wherein the dopant is selected from the group consisting of boron, arsenic, and phosphorus.

24. The method of claim 11, wherein an overlap exists between the shallow junction and the gate electrode.

25. A method of forming a shallow junction for an IGFET, comprising the steps of:

forming a gate insulator on a semiconductor substrate of first conductivity type;

forming a gate electrode on the gate insulator;

forming a sidewall insulator on a vertical edge of the gate electrode;

forming a silicon-based spacer over the substrate and adjacent to the sidewall insulator, wherein the spacer includes a dopant of second conductivity type; and diffusing the dopant from the spacer into the substrate to form a shallow region of the second conductivity type in the substrate beneath the spacer, wherein the shallow region receives essentially all doping of the second conductivity type from the dopant diffused from the spacer, the shallow region provides a lightly doped portion of a drain, the shallow region forms a shallow junction substantially aligned with the edge of the gate electrode, and the shallow region has a depth in the rage of about 0.01 to 0.15 microns.

26. The method of claim 25, wherein the sidewall insulator is spaced from the substrate, and the spacer contacts an edge of the gate insulator and a portion of the substrate beneath the sidewall insulator.

27. The method of claim 25, wherein forming the spacer includes blanket depositing a silicon-based material over the substrate, and then applying an anisotropic etch.

28. The method of claim 27, wherein the dopant is introduced into the silicon-based material before applying the anisotropic etch.

29. The method of claim 27, wherein the dopant is introduced into the spacer after applying the anisotropic etch.

30. The method of claim 25, further comprising etching the substrate after forming the gate electrode and before forming the sidewall insulator and before forming the spacer, wherein an etched portion of the substrate outside the gate electrode is recessed beneath an unetched portion of the substrate underlying the gate electrode.

31. The method of claim 30, wherein the spacer contacts a sidewall of the substrate extending from the etched portion of the substrate to the unetched portion of the substrate, the dopant vertically diffuses into the etched portion of the substrate, and the dopant laterally diffuses through the sidewall into the unetched portion of the substrate thereby providing lateral overlap between the gate electrode and the shallow junction.

32. The method of claim 25, wherein a concentration of the dopant in the shallow region resembles an upper-half of a gaussian distribution along a vertical axis in which a peak concentration is in close proximity to a top surface of the substrate.

33. The method of claim 25, further comprising replacing the spacer with another spacer after diffusing the dopant into the substrate.

34. The method of claim 33, wherein the another spacer is an oxide.

35. The method of claim 25, wherein the gate electrode is polysilicon, the spacer is polysilicon, the gate insulator is an oxide, and the sidewall spacer is an oxide.

36. The method of claim 25, wherein the dopant is selected from the group consisting of boron, phosphorus and arsenic.

37. The method of claim 25, wherein an overlap exists between the shallow junction and the gate electrode.

38. The method of claim 25, wherein the first conductivity type is N-type, the second conductivity type is P-type, and the IGFET is a P-channel device.

39. The method of claim 25, wherein the first conductivity type is P-type, the second conductivity type is N-type, and the IGFET is an N-channel device.

40. A method of forming a shallow junction for a MOSFET, comprising the steps of:

forming a gate oxide on a semiconductor substrate of first conductivity type;

forming a polysilicon gate electrode on the gate oxide, wherein opposing edges of the polysilicon gate electrode and the gate oxide are substantially laterally aligned with one another;

forming sidewall insulators on the edges of the polysilicon gate electrode, wherein the sidewall insulators have essentially a same thickness as the polysilicon gate electrode, the sidewall insulators are spaced from the substrate, and portions of the substrate beneath the sidewall insulators are exposed;

depositing a conformal polysilicon layer over the substrate, wherein the polysilicon layer contacts the sidewall insulators and the edges of the gate oxide and the exposed portions of the substrate beneath the sidewall insulators;

introducing a dopant of second conductivity type into the polysilicon layer;

applying an anisotropic etch such that the polysilicon layer forms polysilicon spacers with substantially a same thickness as the polysilicon gate electrode and the gate oxide combined; and diffusing the dopant from the polysilicon spacers into the substrate by applying heat so as to form shallow regions of the second conductivity type in portions of the substrate beneath the polysilicon spacers, wherein the shallow regions have a depth in the range of 0.01 to 0.15 microns, the shallow regions form an a pair of shallow junctions substantially laterally aligned with the edges of the polysilicon gate electrode.

41. The method of claim 40, further comprising etching the substrate after forming the polysilicon gate electrode and before forming the sidewall insulators and before forming the polysilicon spacers, wherein etched portions of the substrate outside the edges of the polysilicon gate electrode are recessed beneath an unetched portion of the substrate underlying the polysilicon gate electrode, the polysilicon spacers contact sidewalls of the substrate that are substantially laterally aligned with the edges of the polysilicon gate electrode, the dopant vertically diffuses into the etched portions of the substrate beneath the spacers, and the dopant laterally diffuses through the sidewalls into the unetched portion of the substrate thereby providing lateral overlap between the polysilicon gate electrode and the shallow junctions.

42. The method of claim 40, wherein the shallow regions provide a source and a drain for the MOSFET, and the polysilicon spacers are in electrical contact with the shallow regions thereby providing source and drain contacts for the MOSFET.

43. The method of claim 40, further comprising implanting a dopant of the second conductivity type into the substrate using the polysilicon spacers, the sidewall insulators, and the polysilicon gate electrode as an implant mask to form a heavily doped regions in the substrate, and diffusing the implanted dopant into the shallow regions beneath the polysilicon spacers, such that the shallow regions and the heavily doped regions merge to provide a source and a drain for the MOSFET, and the polysilicon spacers are in electrical contact with the heavily doped regions thereby providing source and drain contacts for the MOSFET.

44. The method of claim 40, wherein the dopant is selected from the group consisting of boron, phosphorus and arsenic.

45. The method of claim 40, wherein the sidewall insulators are selected from the group consisting of silicon dioxide and silicon nitride.

46. A method of forming a shallow junction for an IGFET, comprising the steps of:

forming a gate electrode over a semiconductor substrate;

forming a sidewall insulator on an edge of the gate electrode;

forming a silicon-based spacer on the substrate and in close lateral relationship to the gate electrode and on an edge of the sidewall insulator opposite the gate electrode, such that the sidewall insulator laterally separates and electrically isolates the gate electrode and the spacer, and the spacer is formed on a portion of the substrate that is recessed with respect to another portion of the substrate underlying the gate electrode; and diffusing a dopant from the spacer into the substrate to form a shallow junction substantially aligned with an edge of the gate electrode.

47. A method of forming a shallow junction for an IGFET, comprising the steps of:

forming a gate electrode over a semiconductor substrate;

forming a sidewall insulator on an edge of the gate electrode and vertically spaced from the substrate;

forming a silicon-based spacer on the substrate and in close lateral relationship to the gate electrode and on an edge of the sidewall insulator opposite the gate electrode, such that the sidewall insulator laterally separates and electrically isolates the gate electrode and the spacer, and the spacer contacts a portion of the substrate beneath the sidewall insulator; and diffusing a dopant from the spacer into the substrate to form a shallow junction substantially aligned with an edge of the gate electrode.

48. A method of forming a shallow junction for an IGFET, comprising the steps of:

forming a gate electrode over a semiconductor substrate, wherein the gate electrode is a silicon-based material doped to a first conductivity type;

forming a silicon-based spacer over the substrate and in close lateral relationship to the gate electrode, wherein the spacer is a silicon-based material doped to a second conductivity type, and sidewalls of the gate electrode and spacer contact one another and form a PN junction; and diffusing a dopant from the spacer into the substrate to form a shallow junction substantially aligned with an edge of the gate electrode.

49. A method of forming a shallow junction for an IGFET, comprising the steps of:

forming a gate electrode over a semiconductor substrate;

forming a silicon-based spacer over the substrate and in close lateral relationship to the gate electrode; and diffusing a dopant from the spacer into the substrate to form a shallow junction substantially aligned with an edge of the gate electrode, wherein a concentration of the dopant in the shallow region resembles an upper-half of a gaussian distribution along a vertical axis in which a peak concentration is in close proximity to a top surface of the substrate.

50. A method of forming a shallow junction for an IGFET, comprising the steps of:

forming a gate insulator on a semiconductor substrate of first conductivity type;

forming a gate electrode on the gate insulator;

forming a sidewall insulator adjacent to an edge of the gate electrode, wherein the sidewall insulator is vertically spaced from the substrate;

forming a silicon-based spacer over the substrate and adjacent to the sidewall insulator such that the sidewall insulator is between the spacer and the gate electrode, and the spacer contacts a portion of the substrate beneath the sidewall insulator; and diffusing a dopant of second conductive type from the spacer into the substrate so as to form a shallow region of the second conductivity type in the substrate, wherein the shallow region forms a shallow junction substantially aligned with the edge of the gate electrode.

51. A method of forming a shallow junction for an IGFET, comprising the steps of:

forming a gate insulator on a semiconductor substrate of first conductivity type;

forming a gate electrode on the gate insulator; then etching the substrate, thereby forming a recessed portion of the substrate having a sidewall that is substantially laterally aligned with an edge of the gate electrode; then forming a sidewall insulator adjacent to the edge of the gate electrode;

forming a silicon-based spacer over the substrate and adjacent to the sidewall insulator such that the sidewall insulator is between the spacer and the gate electrode; and diffusing a dopant of second conductive type from the spacer into the substrate so as to form a shallow region of the second conductivity type in the substrate, wherein the shallow region forms a shallow junction substantially aligned with the edge of the gate electrode.

52. A method of forming a shallow junction for an IGFET, comprising the steps of:

forming a gate insulator on a semiconductor substrate of first conductivity type;

forming a gate electrode on the gate insulator;

forming a sidewall insulator adjacent to an edge of the gate electrode;

forming a silicon-based spacer over the substrate and adjacent to the sidewall insulator such that the sidewall insulator is between the spacer and the gate electrode; and diffusing a dopant of second conductive type from the spacer into the substrate so as to form a shallow region of the second conductivity type in the substrate, wherein the shallow region forms a shallow junction substantially aligned with the edge of the gate electrode, and a concentration of the dopant in the shallow region resembles an upper-half of a gaussian distribution along a vertical axis in which a peak concentration is in close proximity to a top surface of the substrate.

53. A method of forming a shallow junction for an IGFET, comprising the steps of:

forming a gate insulator on a semiconductor substrate of first conductivity type;

forming a gate electrode on the gate insulator;

forming a sidewall insulator on a vertical edge of the gate electrode, wherein the sidewall insulator is spaced from the substrate;

forming a silicon based spacer over the substrate and adjacent to the sidewall insulator, wherein the spacer contacts an edge of the gate insulator and a portion of the substrate beneath the sidewall insulator, and the spacer includes a dopant of second conductivity type; and diffusing the dopant from the space into the substrate to form a shallow region of the second conductivity type in the substrate beneath the spacer, wherein the shallow region receives essentially all doping of the second conductivity type from the dopant diffused from the spacer, the shallow region provides a lightly doped portion a drain, and the shallow region forms a shallow junction substantially aligned with the edge of the gate electrode.

54. A method of forming a shallow junction for an IGFET, comprising the steps of:

forming a gate insulator on a semiconductor substrate of first conductivity type;

forming a gate electrode on the gate insulator; then etching the substrate, wherein an etched portion of the substrate outside the gate electrode is recessed beneath an unetched portion of the substrate underlying the gate electrode; then forming a sidewall insulator on a vertical edge of the gate electrode;

forming a silicon-based spacer over the substrate and adjacent to the sidewall insulator, wherein the spacer includes a dopant of second conductivity type; and diffusing the dopant from the spacer into the substrate to form a shallow region of the second conductivity type in the substrate beneath the spacer, wherein the shallow region receives essentially all doping of the second conductivity type from the dopant diffused from the spacer, the shallow region provides a lightly doped portion of a drain, and the shallow region forms a shallow junction substantially aligned with the edge of the gate electrode.

55. A method of forming a shallow junction for an IGFET, comprising the steps of:

forming a gate insulator on a semiconductor substrate of first conductivity type;

forming a gate electrode on the gate insulator;

forming a sidewall insulator on a vertical edge of the gate electrode;

forming a silicon-based spacer over the substrate and adjacent to the sidewall insulator, wherein the spacer includes a dopant of second conductivity type; and diffusing the dopant from the spacer into the substrate to form a shallow region of the second conductivity type in the substrate beneath the spacer, wherein the shallow region receives essentially all doping of the second conductivity type from the dopant diffused from the spacer, the shallow region provides a lightly doped portion of a drain, the shallow region forms a shallow junction substantially aligned with the edge of the gate electrode, and a concentration of the dopant in the shallow region resembles an upper-half of a gaussian distribution along a vertical axis in which a peak concentration is in close proximity to a top surface of the substrate.

56. A method of forming a shallow junction for an IGFET, comprising the steps of:

forming a gate insulator on a semiconductor, or substrate of first conductivity type;

forming a gate electrode on the gate insulator;

forming a sidewall insulator on a vertical edge of the gate electrode;

forming a silicon-based spacer over the substrate and adjacent to the sidewall insulator, wherein the spacer includes a dopant of second conductivity type, diffusing the dopant from the spacer into the substrate to form a shallow region of the second conductivity type in the substrate beneath the spacer, wherein the shallow region receives essentially all doping of the second conductivity type from the dopant diffused from the spacer, the shallow region provides a lightly doped portion of a drain, and the shallow region forms a shallow junction substantially aligned with the edge of the gate electrode; and replacing the spacer with another spacer after diffusing the dopant into the substrate.

57. A method of making an integrated circuit chip, comprising: forming an IGFET, including:

forming a date electrode over a semiconductor substrate;

forming a silicon-based spacer over the substrate and in close lateral relationship to the gate electrode; and diffusing a dopant from the spacer into the substrate to form a shallow source/drain region with a shallow junction substantially aligned with an edge of the gate electrode, wherein the shallow source/drain region has a depth in the range of about 0.01 to 0.15 microns.

* * * * *

UNITED STATES PATENT AND TRADEMARK OFFICE
CERTIFICATE OF CORRECTION

PATENT NO. : 5,710,054
DATED : January 20, 1998
INVENTOR(S) : Gardner, Mark I.; Dawson, Robert; Fulford, H. Jim, Jr.; Hause, Frederick N.; Michael, Mark W.; Moore, Bradley T.; Wristers, Derick J.

It is certified that error appears in the above-identified patent and that said Letters Patent is hereby corrected as shown below:

Col. 4, line 12, delete "robe" and insert --tube--.
Col. 4, lines 30-31, delete "isotropic" and insert --anisotropic--.
Col. 5, line 59, delete "electfical" and insert --electrical--.
Col. 11, line 15, delete "robe" and insert --tube--.
Col. 12, line 48, delete "0.1" and insert --0.15--.
Col. 17, line 43, after "portion" insert --of--.
Col. 17, line 38, delete "space" and insert --spacer--.
Col. 18, line 32, delete "semiconductor, or substrate" and insert --semiconductor substrate--.

Signed and Sealed this

Twenty-fourth Day of November, 1998

Attest:

BRUCE LEHMAN

Attesting Officer   Commissioner of Patents and Trademarks